(12) United States Patent
Powell et al.

(10) Patent No.: US 10,320,394 B1
(45) Date of Patent: Jun. 11, 2019

(54) SUPERCONDUCTING CIRCUITS FOR AN A-AND-NOT-B GATE HAVING AN EXCLUSIVE-OR GATE AND AN AND GATE

(71) Applicant: Microsoft Technology Licensing, LLC, Redmond, WA (US)

(72) Inventors: Jack R. Powell, Los Angeles, CA (US); Alexander L. Braun, Baltimore, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/137,731

(22) Filed: Sep. 21, 2018

(51) Int. Cl.
*H03K 19/21* (2006.01)
*G06N 10/00* (2019.01)
*H03K 19/00* (2006.01)
*H03K 19/195* (2006.01)

(52) U.S. Cl.
CPC ............. *H03K 19/21* (2013.01); *G06N 10/00* (2019.01); *H03K 19/0008* (2013.01); *H03K 19/1952* (2013.01)

(58) Field of Classification Search
None
See application file for complete search history.

(56) References Cited

U.S. PATENT DOCUMENTS

7,724,020 B2   5/2010   Herr
2018/0226974 A1   8/2018   Harms et al.

*Primary Examiner* — Jany Richardson
(74) *Attorney, Agent, or Firm* — Ranjeev Singh; Singh Law, PLLC (57) ABSTRACT

Superconducting circuits-based devices and methods for an A-and-not-B gate are provided. In one example, a circuit for an A-and-not-B gate including an output terminal, a first input terminal for receiving a first set of single flux quantum (SFQ) pulses, and a second input terminal for receiving a second set of SFQ pulses is provided. The circuit may further include a first stage configured to perform an exclusive-OR operation on the first set of SFQ pulses received via the first input terminal and the second set of SFQ pulses received via the second input terminal to generate an exclusive-OR result. The circuit may further include a second stage, coupled to the first stage, configured to perform an AND operation on the exclusive-OR result and the first set of SFQ pulses received via the first input terminal and provide an output via the output terminal.

20 Claims, 4 Drawing Sheets

SUPERCONDUCTING CIRCUITS FOR AN A-AND-NOT-B GATE HAVING AN EXCLUSIVE-OR GATE AND AN AND GATE

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, a certain amount of power is wasted not only as a result of the requirement to maintain the state of the CMOS transistors, but also as a result of the current leakage.

An alternative approach to the use of processors and related components, based on CMOS technology, is the use of superconducting logic based devices.

SUMMARY

In one example, the present disclosure relates to a circuit for an A-and-not-B gate including an output terminal, a first input terminal for receiving a first set of single flux quantum (SFQ) pulses, and a second input terminal for receiving a second set of SFQ pulses. The circuit may further include a first stage configured to perform an exclusive-OR operation on the first set of SFQ pulses received via the first input terminal and the second set of SFQ pulses received via the second input terminal to generate an exclusive-OR result. The circuit may further include a second stage, coupled to the first stage, configured to perform an AND operation on the exclusive-OR result and the first set of SFQ pulses received via the first input terminal and provide an output via the output terminal.

In another aspect, the present disclosure relates to a method of operating a circuit for an A-and-not-B gate, where the circuit includes an output terminal. The method may include receiving a first set of single flux quantum (SFQ) pulses via a first input terminal. The method may further include receiving a second set of SFQ pulses via a second input terminal. The method may further include performing an exclusive-OR operation on the first set of SFQ pulses received via the first input terminal and the second set of SFQ pulses received via the second input terminal to generate an exclusive-OR result. The method may further include performing an AND operation on the exclusive-OR result and the first set of SFQ pulses received via the first input terminal such that the circuit is configured to pass the first set of SFQ pulses to the output terminal only when inputs to the exclusive-OR operation differ and inputs to the AND operation are the same.

In yet another aspect, the present disclosure relates to a circuit an A-and-not-B gate including an output terminal, a first input terminal for receiving a first set of single flux quantum (SFQ) pulses, a powered junction coupled to first input terminal, and a second input terminal for receiving a second set of SFQ pulses. The circuit may further include a first stage configured to perform an exclusive-OR operation on the first set of SFQ pulses received via the first input terminal and the second set of SFQ pulses received via the second input terminal to generate an exclusive-OR result. The circuit may further include a second stage, coupled to the first stage, configured to perform an AND operation on the exclusive-OR result and the first set of SFQ pulses received via the first input terminal such that the circuit is configured to pass the first set of SFQ pulses to the output terminal only when inputs to the exclusive-OR operation differ and inputs to the AND operation are the same. The circuit may further include a powered junction coupled to the output terminal.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Examples described in this disclosure relate to superconducting logic-based circuits for A-and-not-B gates. Certain examples further relate to reciprocal quantum logic (RQL) based circuits for A-and-not-B gates including an escape junction. Such RQL based gates may include RQL circuits that may act as low-power superconductor logic circuits. Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have almost zero resistance at or below their critical temperature. One example superconductor, Niobium, has a critical temperature (Tc) of 9.3 Kelvin. At temperatures below Tc, Niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type of junctions, when a wave function tunnels through the barrier, a changing phase difference in time in the two superconductors creates a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power, thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B gate and a logical AND/OR gate. The A-and-not-B gate may have two inputs and one output. An input pulse A may propagate to the output when favorable clock conditions may be present on an output Josephson transmission line (JTL), unless an input pulse B comes first with respect to either input pulse A or the favorable clock conditions on the output JTL. The logical behavior of the gate is based on the reciprocal data encoding mentioned earlier. As an example, a positive pulse changes the internal flux state of the inductive loop, but the trailing negative pulse erases the internal state every clock cycle, which in turn produces combinational logic behavior.

Figure 1:
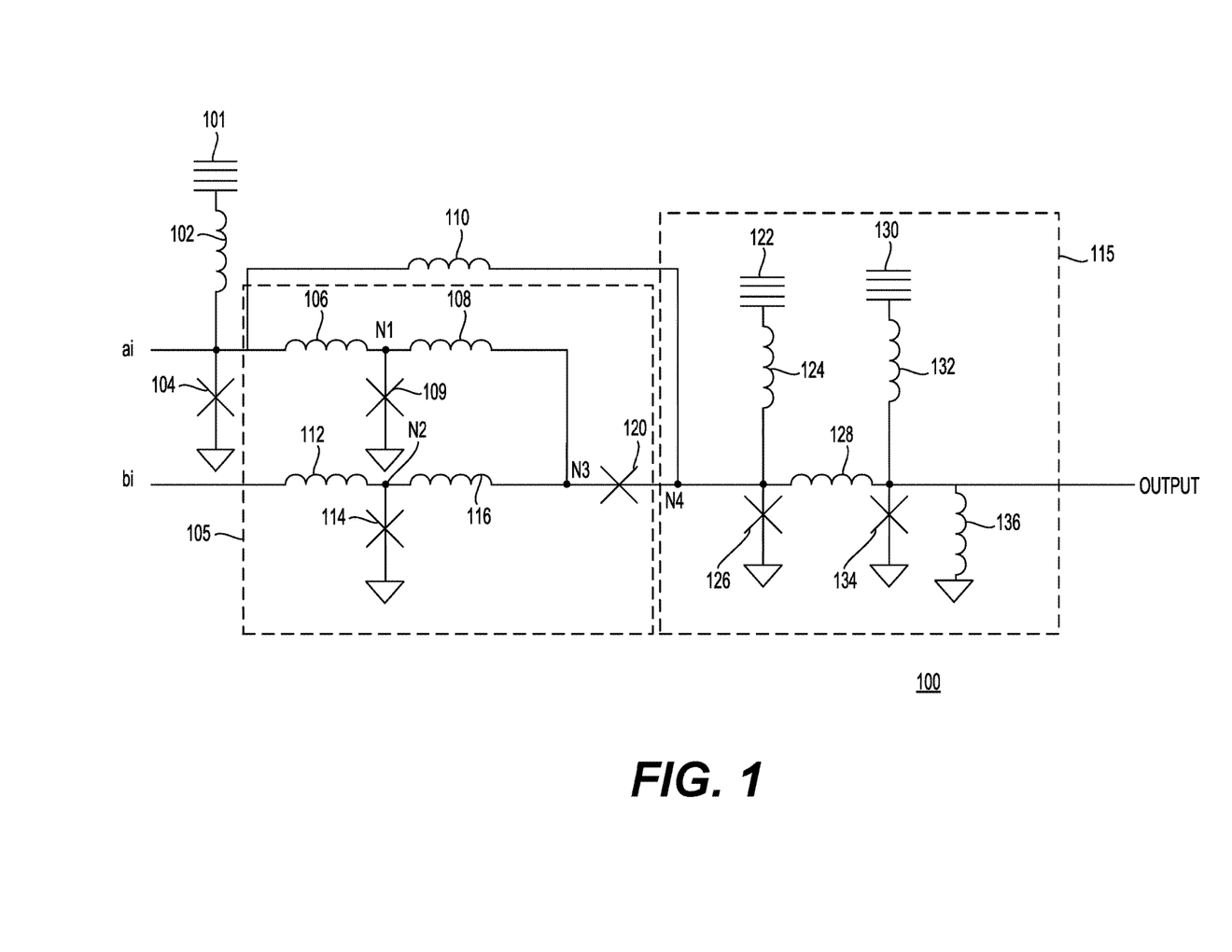
FIG. 1 is a diagram of a circuit for an A-and-not-B gate including an escape junction in accordance with one example.

FIG. 1 is a diagram of a circuit for an A-and-not-B gate 100 in accordance with one example. As shown in FIG. 1, the circuit for A-and-not-B gate 100 does not include any large transformers and that may make the design advantageously more area efficient. A-and-not-B gate 100 may be configured to receive a first signal at an input ai (input ai may be viewed as an input terminal) and a second signal at an input bi (input bi may be viewed as another input terminal) as shown in FIG. 1. A-and-not-B gate 100 may provide the signal received at the input ai as an output signal at the output terminal, unless its propagation is blocked. In this example, the circuit for A-and-not-B gate 100 may include a powered Josephson junction at the input ai. The powered Josephson junction may include a bias terminal 101, an inductor 102, and a Josephson junction 104. Bias terminal 101 may provide both AC bias and DC bias, as needed. In this example, the powered Josephson junction may be used to amplify an input received at the input ai. In addition, the powered Josephson junction may allow the circuit for A-and-not-B gate to be driven by Josephson transmission lines (JTLs) with more conventionally sized inductors.

The circuit for A-and-not-B gate 100 may further include a first stage 105 and a second stage 115. The first stage 105 may include an inductor 106 coupled between the input ai and a node N1. The first stage 105 may further include a Josephson junction 109 coupled between the node N1 and a ground terminal. The first stage 105 may further include an inductor 108 coupled between the node N1 and a node N3. The first stage 105 may further include an inductor 112 coupled between the input bi and a node N2. The first stage 105 may further include a Josephson junction 114 coupled between the node N2 and a ground terminal. The first stage 105 may further include an inductor 116 coupled between the node N2 and the node N3.

With continued reference to FIG. 1, the first stage 105 may further include an escape junction 120 having a first end and a second end. The first end of escape junction 120 may be coupled to the node N3 such that it may receive any single flux quantum (SFQ) pulses received via the input bi. The second end of escape junction 120 may be coupled to a node N4, which may be coupled via an inductor to the input ai, such that the second end is coupled to receive any SFQ pulses received via the input ai. Escape junction 120 may allow pulses received via the second end (from the input ai) at the node N4 to proceed as long as no pulses arrive prior to or at the same time at node N3 presenting the same values at the node N3. This way, the first stage 105 may be configured to pass an output only when the inputs (received via the input ai and the input bi) differ. In other words, first stage 105 may be configured to perform an exclusive-OR operation on the inputs received by first stage 105.

Still referring to FIG. 1, the circuit for A-and-not-B gate 100 may further include a second stage 115 configured to perform an AND operation on inputs received by the second stage 115. One of the inputs to the second stage may be the SFQ pulses received via the input ai, which may be coupled via an inductor 110 to the input of the second stage 115. The second input to the second stage 115 may be the output of the first stage 105, which is the result of the exclusive-OR operation on the SFQ pulses received via the input ai and the input bi. The second stage 115 may include another powered junction, coupled to the node N4, including a bias terminal 122, an inductor 124, and a Josephson junction 126 as shown in FIG. 1. The second stage 115 may further include an inductor 128 coupled between the node N4 and the output terminal. Another powered junction including a bias terminal 130, an inductor 132, and a Josephson junction 134 may be coupled to the output terminal as shown in FIG. 1. Another inductor 136 may be coupled between the output terminal and the ground terminal. From a Boolean algebra point of view, the circuit for A-and-not-B 100 operates to provide the desired functionality because of equivalence of $A \cdot (A \otimes B)$ with $A \cdot \overline{B}$. Example derivation of this equivalence is shown below:

$$A \cdot (A \otimes B) =$$

$$(A \cdot A) \otimes (A \cdot B) =$$

$A \otimes (A \cdot B) =$ $A \cdot \overline{(1 \otimes B)} =$ $A \cdot \overline{B}$ Although FIG. 1 shows a certain number of components of the circuit for the A-and-not-B gate 100 arranged in a certain manner, there could be more or fewer number of components arranged differently. As an example, although FIG. 1 shows a powered Josephson junction (including a bias terminal 101, an inductor 102, and a Josephson junction 104), a circuit for A-and-not-B gate 100 need not include the powered Josephson junction at the input ai.

Figure 2:
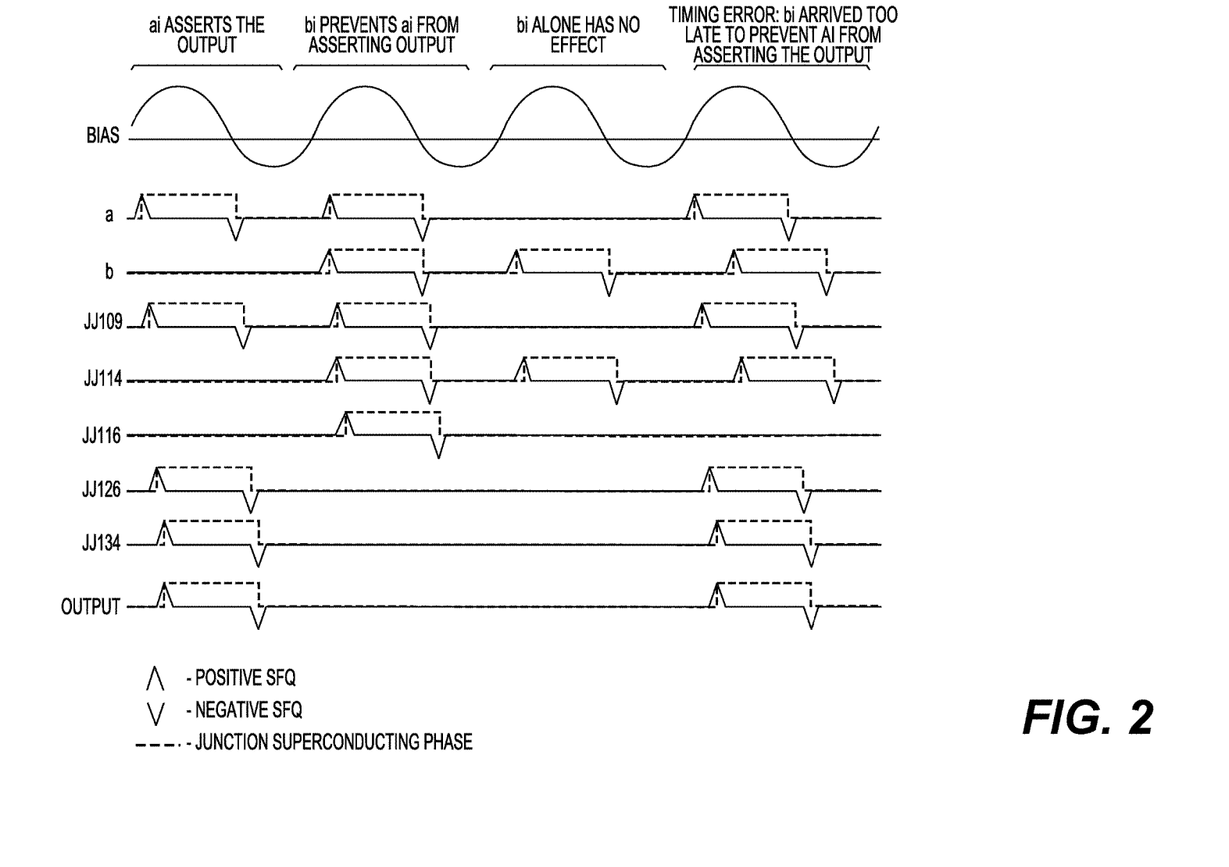
FIG. 2 shows waveforms associated with the circuit of A-and-not-B gate of FIG. 1 in accordance with one example.

FIG. 2 shows waveforms associated with the circuit of A-and-not-B gate 100 of FIG. 1 in accordance with one example. The waveforms are shown to illustrate the status of the various signals corresponding to the circuit of A-and-not-B gate 100 of FIG. 1 during four possible scenarios: (1) ai asserts the output, (2) bi prevents ai from asserting the output, (3) bi alone has no effect, and (4) timing error: bi arrived too late to prevent ai from asserting the output. During the first scenario, when a signal (e.g., a reciprocal quantum logic signal including a positive SFQ pulse trailed by a negative SFQ pulse) arrives only at the input ai, the first stage 105 performs an exclusive-OR operation and because the inputs differ, the result is that the SFQ pulses arrive as one input to the second stage 115. The SFQ pulses received via the input ai also arrive at the second input of the second stage via inductor 110. The second stage 115 performs an AND operation resulting in the assertion of the output terminal of the SFQ pulses received via the input ai. During this scenario, in this example, in terms of the behavior of the components of the first stage, Josephson junction (JJ) 109 is triggered by the receipt of the SFQ pulses at the input ai. The single set of pulses received by the escape junction (JJ 116) go through as input at node N4 (input to the second stage 115). The second stage 115 receives the SFQ pulses at the node N4 from both the first stage 105 and the input ai (via inductor 110). This in turn triggers JJ 126, which causes the passing of the SFQ pulses to inductor 128. This is because the combination of the two versions of the SFQ pulses received via the input ai are sufficient to trigger JJ 126. That in turn triggers JJ 134, which causes the providing of an output as a result of the SFQ pulses received via the input ai alone.

During the second scenario, in this example, signals (e.g., reciprocal quantum logic signals including a positive SFQ pulse trailed by a negative SFQ pulse) arrive both at the input ai and the input bi. Once again, the first stage 105 performs an exclusive-OR operation and because the inputs are the same, the result is that no SFQ pulses arrive as a result of the exclusive-OR operation as an input (node N4) to the second stage 115. The SFQ pulses received via the input ai also arrive at the second input (node N4) of the second stage via inductor 110. The second stage 115 performs an AND operation resulting in no signal being asserted at the output terminal. During this scenario, in terms of the behavior of the components of the first stage 105, JJ 109 is triggered by the SFQ pulses arriving at the input ai and JJ 114 is triggered by the pulses arriving at the input bi. Escape junction 116 (also referred to as JJ 116) rejects the pair of pulses and only the SFQ pulses received from the input ai via inductor 110 are received as input to the second stage 115. The single set of SFQ pulses received via the input ai are not sufficient to trigger JJ 126 of the second stage 115 and so no output is generated as a result.

During the third scenario, a signal (e.g., a reciprocal quantum logic signal including a positive SFQ pulse trailed by a negative SFQ pulse) arrives at the input bi, but no signal arrives at the input ai. The first stage 105 performs an exclusive-OR operation on the inputs. Because the inputs differ, the result is that the SFQ pulses arrive as one input to the second stage 115. However, no input SFQ pulses arrive from the input bi and thus the AND operation performed by the second stage 115 results in no output at the output terminal. In terms of the internal behavior of the components of the two stages, during this scenario, the SFQ pulses received via the input bi alone trigger JJ 114. The escape junction 120 allows the pulses to proceed forward, but they are not sufficient to trigger JJ 126 of the second stage 115 and thus no output is asserted.

During the fourth scenario, in this example, a signal (e.g., a reciprocal quantum logic signal including a positive SFQ pulse trailed by a negative SFQ pulse) arrives at the input bi, but it is too late to prevent the signal that had already arrived at the input ai from passing to the output. This is a timing error case. With respect to the first stage, the arriving SFQ pulses at the input ai trigger JJ 109. No input pulses have yet arrived at the input bi. The first stage 105 performs an exclusive-OR operation on the inputs and because the inputs differ, the result is that the SFQ pulses arrive as one input to the second stage 115. The SFQ pulses received via the input ai also arrive at the second input of the second stage via inductor 110. The second stage 115 performs an AND operation resulting in the assertion of the output terminal of the SFQ pulses received via the input ai. During this scenario, in this example, in terms of the behavior of the components of the first stage, Josephson junction (JJ) 109 is triggered by the receipt of the SFQ pulses at the input ai. The single set of pulses received by escape junction (JJ 116) go through as input at node N4 (input to the second stage 115). The second stage 115 receives the SFQ pulses at the node N4 from both the first stage 105 and the input ai (via inductor 110). This in turn triggers JJ 126, which causes the passing the of the SFQ pulses to inductor 128. This is because the combination of the two versions of the SFQ pulses received via the input ai are sufficient to trigger JJ 126. That in turn triggers JJ 134, which causes the providing of an output as a result of the SFQ pulses received via the input ai alone. Thus, the SFQ pulses arriving at the input bi are too late to prevent the pulses arriving via the input ai from asserting the output. They do, however, trigger JJ 114 as shown in FIG. 2.

Figure 3:
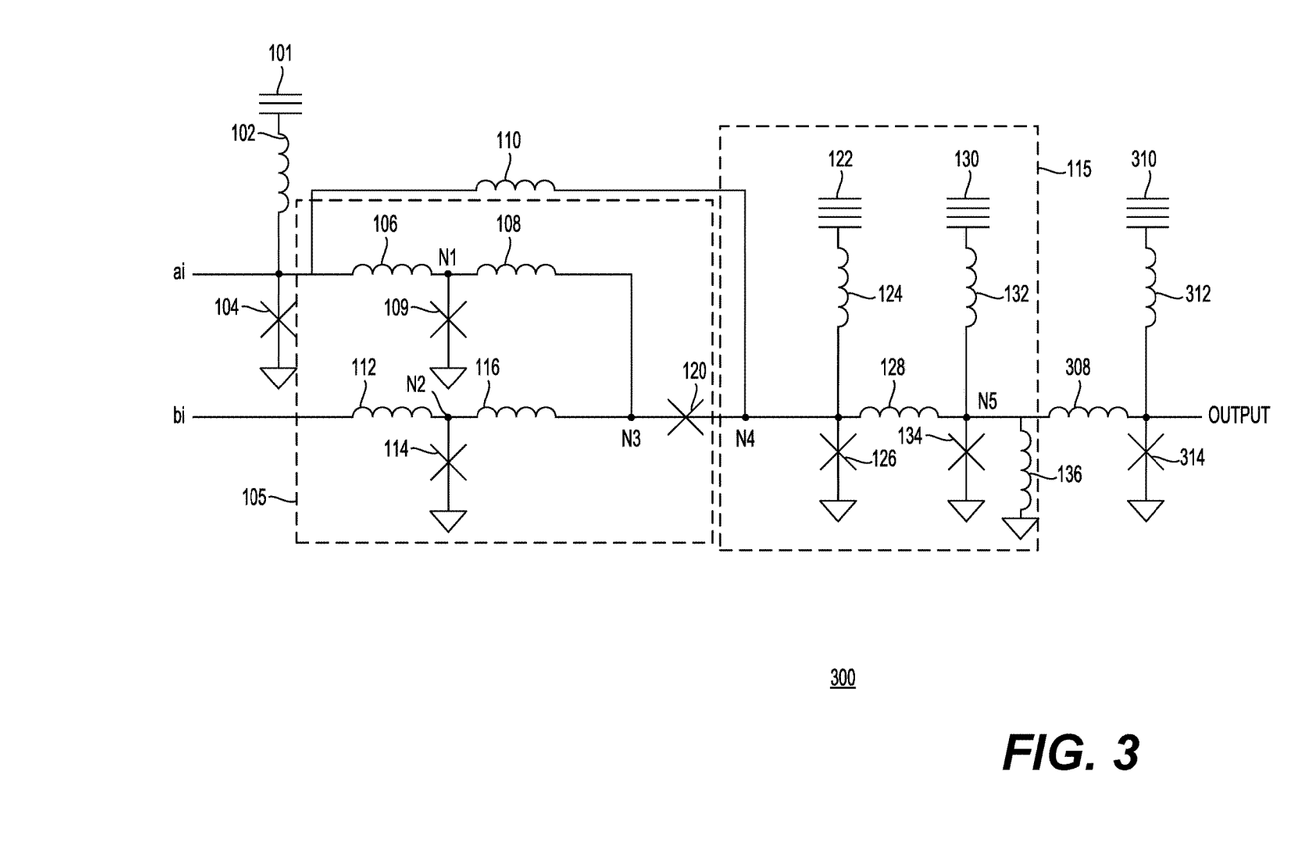
FIG. 3 is a diagram of another circuit for an A-and-not-B gate in accordance with one example.

FIG. 3 is a diagram of another circuit for an A-and-not-B gate 300 in accordance with one example. Many of the elements of the circuit for an A-and-not-B gate 300 are the same as the circuit for the A-and-not-B gate 100 and thus have been labeled using the same reference numerals. In addition to the elements of the circuit for the A-and-not-B gate 100, the circuit for the A-and-not-B gate 300 further includes an inductor 308. Inductor 308 is coupled between node N5 (previously the output terminal) and the new output terminal. A powered junction including a bias terminal 310, an inductor 312, and a Josephson junction 314 is added at the output terminal. Bias terminal 310 may provide both AC bias and DC bias, as needed. In this example, the powered junction is used to isolate the grounded inductor (inductor 136) from the output of the circuit for A-and-not-B gate 300. In addition, the powered junction allows the circuit for A-and-not-B gate 300 to provide more current at the output terminal. Other than these additional operational changes, the circuit for the A-and-not-B gate 300 operates in the same manner as explained earlier with respect to FIG. 1 and FIG.

2. Although FIG. 3 shows a certain number of components of the circuit for the A-and-not-B gate 300 arranged in a certain manner, there could be more or fewer number of components arranged differently.

Figure 4:
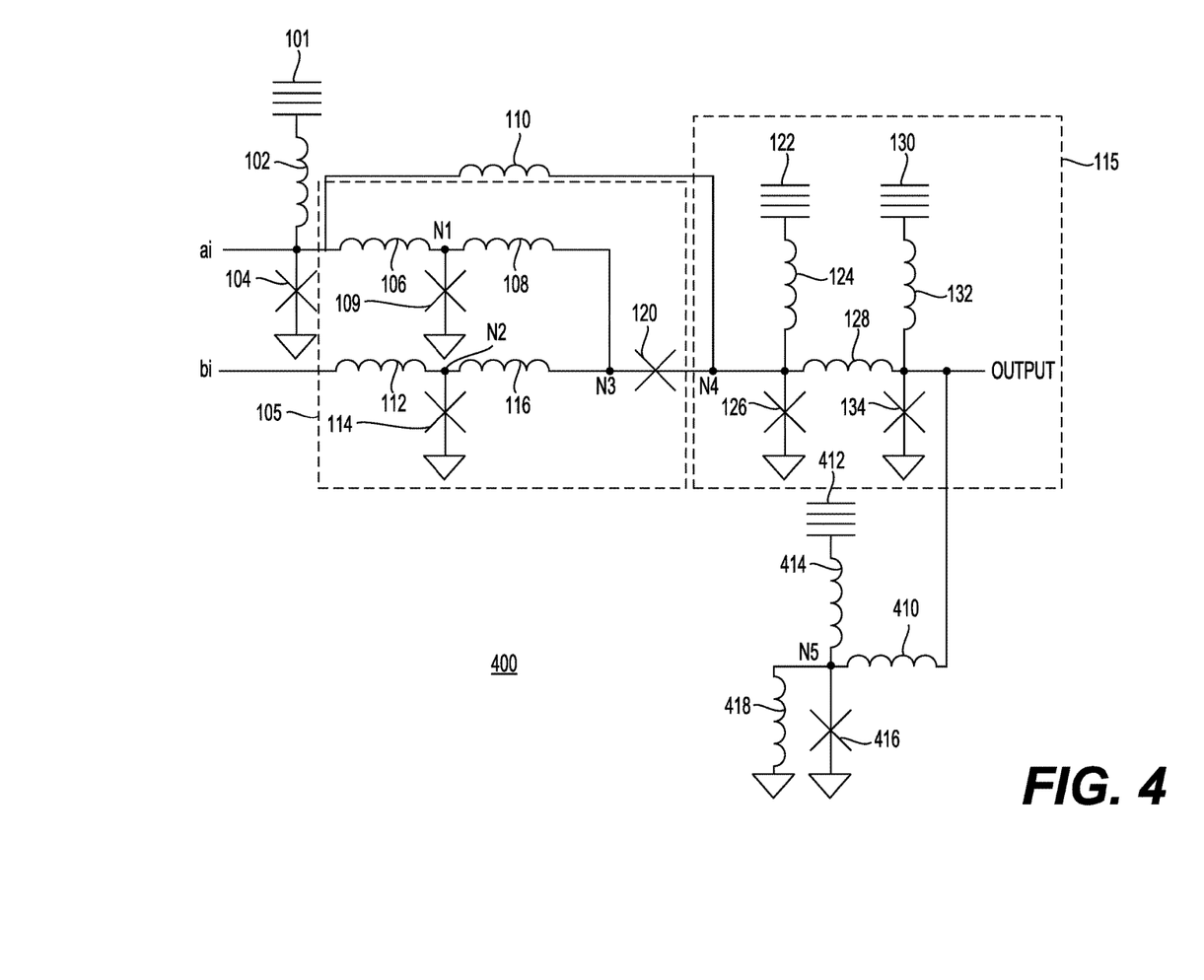
FIG. 4 is a diagram of another circuit for an A-and-not-B gate in accordance with one example.

FIG. 4 is a diagram of another circuit for an A-and-not-B gate 400 in accordance with one example. Many of the elements of the circuit for an A-and-not-B gate 400 are the same as the circuit for the A-and-not-B gate 100 and thus have been labeled using the same reference numerals. In addition to the elements of the circuit for the A-and-not-B gate 100, the circuit for the A-and-not-B gate 400 further includes an inductor 410. Inductor 410 is coupled between the output terminal and node N5. A powered junction including a bias terminal 412, an inductor 414, and a Josephson junction 416 is arranged in parallel to the output terminal. Bias terminal 412 may provide both AC bias and DC bias, as needed. An inductor 418 is coupled between node N5 and the ground terminal. This allows the circuit for the A-and-not-B gate 400 to work with conventionally sized elements, such as Josephson transmission lines (JTLs). Other than these additional operational changes, the circuit for the A-and-not-B gate 400 operates in the same manner as explained earlier with respect to FIG. 1 and FIG. 2. Although FIG. 4 shows a certain number of components of the circuit for the A-and-not-B gate 400 arranged in a certain manner, there could be more or fewer number of components arranged differently.

In conclusion, a circuit for an A-and-not-B gate including an output terminal, a first input terminal for receiving a first set of single flux quantum (SFQ) pulses, and a second input terminal for receiving a second set of SFQ pulses is provided. The circuit may further include a first stage configured to perform an exclusive-OR operation on the first set of SFQ pulses received via the first input terminal and the second set of SFQ pulses received via the second input terminal to generate an exclusive-OR result. The circuit may further include a second stage, coupled to the first stage, configured to perform an AND operation on the exclusive-OR result and the first set of SFQ pulses received via the first input terminal and provide an output via the output terminal.

The first stage may comprise an escape junction. The escape junction may comprise a Josephson junction. The first stage may further include a first inductor coupled between the first input terminal and a first node, a first Josephson junction coupled between the first node and a ground terminal, and a second inductor coupled between the first node and a second node. The first stage may further include a third inductor coupled between the second input terminal and a third node, a second Josephson junction coupled between the third node and the ground terminal, and an escape junction coupled between the second node and a fourth node.

The second stage may further include a powered junction coupled between the fourth node and the output terminal. The powered junction may comprise a bias terminal coupled to an inductor for powering a third Josephson junction coupled between the fourth node and the ground terminal.

In another aspect, the present disclosure relates to a method of operating a circuit for an A-and-not-B gate, where the circuit includes an output terminal. The method may include receiving a first set of single flux quantum (SFQ) pulses via a first input terminal. The method may further include receiving a second set of SFQ pulses via a second input terminal. The method may further include performing an exclusive-OR operation on the first set of SFQ pulses received via the first input terminal and the second set of SFQ pulses received via the second input terminal to generate an exclusive-OR result. The method may further include performing an AND operation on the exclusive-OR result and the first set of SFQ pulses received via the first input terminal such that the circuit is configured to pass the first set of SFQ pulses to the output terminal only when inputs to the exclusive-OR operation differ and inputs to the AND operation are the same.

The exclusive-OR operation may be performed using a first stage and the AND operation is performed using a second stage coupled to the first stage. The first stage may comprise an escape junction. The escape junction may comprise a Josephson junction. The first stage may further include a first inductor coupled between the first input terminal and a first node, a first Josephson junction coupled between the first node and a ground terminal, and a second inductor coupled between the first node and a second node. The first stage may further include a third inductor coupled between the second input terminal and a third node, a second Josephson junction coupled between the third node and the ground terminal, and an escape junction coupled between the second node and a fourth node.

The second stage may further include a powered junction coupled between the fourth node and the output terminal. The powered junction may comprise a bias terminal coupled to an inductor for powering a third Josephson junction coupled between the fourth node and the ground terminal.

In yet another aspect, the present disclosure relates to a circuit an A-and-not-B gate including an output terminal, a first input terminal for receiving a first set of single flux quantum (SFQ) pulses, a powered junction coupled to first input terminal, and a second input terminal for receiving a second set of SFQ pulses. The circuit may further include a first stage configured to perform an exclusive-OR operation on the first set of SFQ pulses received via the first input terminal and the second set of SFQ pulses received via the second input terminal to generate an exclusive-OR result. The circuit may further include a second stage, coupled to the first stage, configured to perform an AND operation on the exclusive-OR result and the first set of SFQ pulses received via the first input terminal such that the circuit is configured to pass the first set of SFQ pulses to the output terminal only when inputs to the exclusive-OR operation differ and inputs to the AND operation are the same. The circuit may further include a powered junction coupled to the output terminal.

The first stage may comprise an escape junction. The escape junction may comprise a Josephson junction. The first stage may further include a first inductor coupled between the first input terminal and a first node, a first Josephson junction coupled between the first node and a ground terminal, and a second inductor coupled between the first node and a second node. The first stage may further include a third inductor coupled between the second input terminal and a third node, a second Josephson junction coupled between the third node and the ground terminal, and an escape junction coupled between the second node and a fourth node.

It is to be understood that the methods, modules, devices, systems, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A circuit for an A-and-not-B gate comprising:
an output terminal;
a first input terminal for receiving a first set of single flux quantum (SFQ) pulses;
a second input terminal for receiving a second set of SFQ pulses;
a first stage configured to perform an exclusive-OR operation on the first set of SFQ pulses received via the first input terminal and the second set of SFQ pulses received via the second input terminal to generate an exclusive-OR result; and
a second stage, coupled to the first stage, configured to perform an AND operation on the exclusive-OR result and the first set of SFQ pulses received via the first input terminal and provide an output via the output terminal.

2. The circuit of claim 1, wherein the first stage comprises an escape junction.

3. The circuit of claim 2, wherein the escape junction comprises a Josephson junction.

4. The circuit of claim 1, wherein the first stage comprises a first inductor coupled between the first input terminal and a first node, a first Josephson junction coupled between the first node and a ground terminal, and a second inductor coupled between the first node and a second node.

5. The circuit of claim 4, wherein the first stage further comprises a third inductor coupled between the second input terminal and a third node, a second Josephson junction coupled between the third node and the ground terminal, and an escape junction coupled between the second node and a fourth node.

6. The circuit of claim 5, wherein the second stage comprises a powered junction coupled between the fourth node and the output terminal.

7. The circuit of claim 6, wherein the powered junction comprises a bias terminal coupled to an inductor for powering a third Josephson junction coupled between the fourth node and the ground terminal.

8. A method of operating a circuit for an A-and-not-B gate, wherein the circuit including an output terminal, the method comprising:
receiving a first set of single flux quantum (SFQ) pulses via a first input terminal;
receiving a second set of SFQ pulses via a second input terminal;
performing an exclusive-OR operation on the first set of SFQ pulses received via the first input terminal and the second set of SFQ pulses received via the second input terminal to generate an exclusive-OR result; and
performing an AND operation on the exclusive-OR result and the first set of SFQ pulses received via the first input terminal such that the circuit is configured to pass the first set of SFQ pulses to the output terminal only when inputs to the exclusive-OR operation differ and inputs to the AND operation are the same.

9. The method of claim 8, wherein the exclusive-OR operation is performed using a first stage and the AND operation is performed using a second stage coupled to the first stage.

10. The method of claim 9, wherein the first stage comprises an escape junction.

11. The method of claim 10, wherein the escape junction comprises a Josephson junction.

12. The method of claim 9, wherein the first stage comprises a first inductor coupled between the first input terminal and a first node, a first Josephson junction coupled between the first node and a ground terminal, and a second inductor coupled between the first node and a second node.

13. The method of claim 12, wherein in the first stage further comprises a third inductor coupled between the second input terminal and a third node, a second Josephson junction coupled between the third node and the ground terminal, and an escape junction coupled between the second node and a fourth node.

14. The method of claim 13, wherein the second stage comprises a powered junction coupled between the fourth node and the output terminal.

15. The method of claim 14, wherein the powered junction comprises a bias terminal coupled to an inductor for powering a third Josephson junction coupled between the fourth node and the ground terminal.

16. A circuit for an A-and-not-B gate comprising:
an output terminal;
a first input terminal for receiving a first set of single flux quantum (SFQ) pulses;
a powered junction coupled to the first input terminal;
a second input terminal for receiving a second set of SFQ pulses;
a first stage configured to perform an exclusive-OR operation on the first set of SFQ pulses received via the first input terminal and the second set of SFQ pulses received via the second input terminal to generate an exclusive-OR result;
a second stage, coupled to the first stage, configured to perform an AND operation on the exclusive-OR result and the first set of SFQ pulses received via the first input terminal such that the circuit is configured to pass the first set of SFQ pulses to the output terminal only when inputs to the exclusive-OR operation differ and inputs to the AND operation are the same; and
a powered junction coupled to the output terminal.

17. The circuit of claim 16, wherein the first stage comprises an escape junction.

18. The circuit of claim 17, wherein the escape junction comprises a Josephson junction.

19. The circuit of claim 16, wherein the first stage comprises a first inductor coupled between the first input terminal and a first node, a first Josephson junction coupled between the first node and a ground terminal, and a second inductor coupled between the first node and a second node.

20. The circuit of claim 19, wherein in the first stage further comprises a third inductor coupled between the second input terminal and a third node, a second Josephson junction coupled between the third node and the ground terminal, and an escape junction coupled between the second node and a fourth node.

* * * * *